(12) United States Patent
Kim (10) Patent No.: US 6,198,674 B1
(45) Date of Patent: Mar. 6, 2001

(54) DATA STROBE SIGNAL GENERATOR OF SEMICONDUCTOR DEVICE USING TOGGLED PULL-UP AND PULL-DOWN SIGNALS

(75) Inventor: Kwan-Weon Kim, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/475,056

(22) Filed: Dec. 30, 1999

(30) Foreign Application Priority Data

Dec. 30, 1998 (KR) .................................. 98-61121

(51) Int. Cl.[7] ........................................ G11C 7/00
(52) U.S. Cl. ................................................ 365/193
(58) Field of Search ............................. 365/193, 189.11, 365/233.5

(56) References Cited

U.S. PATENT DOCUMENTS 5,500,831 * 3/1996 Cuen et al. ......................... 365/193

* cited by examiner

*Primary Examiner*—Tan T. Nguyen
(74) *Attorney, Agent, or Firm*—Jacobson, Price, Holman & Stern, PLLC (57) ABSTRACT

Disclosed is a data strobe signal generator of the SDRAM device. The data strobe signal generator according to the present invention does not have to use a current output state signal generator, by using a pipe counter signal which has been issued at the previous read operation, thereby proving various advantages, such as simple circuit design, simple operation and small chip size. A data strobe signal generator in a SDRAM memory device, includes: a preamble controller for controlling a preamble state of a data strobe signal in response to a control signal; a plurality of pull-up/pull-down signal drivers for producing pull-up and pull-down signals through a toggling operation in response to previous pull-down and pull-up signals; and a data strobe signal driver for outputting the data strobe signal in response to the pull-up and pull-down signals.

7 Claims, 14 Drawing Sheets

DATA STROBE SIGNAL GENERATOR OF SEMICONDUCTOR DEVICE USING TOGGLED PULL-UP AND PULL-DOWN SIGNALS

FIELD OF THE INVENTION

The present invention relates to a semiconductor device; and, more particularly, to a data strobe signal generator of the SDRAM and DDR SDRAM device.

DESCRIPTION OF THE PRIOR ARTS

Generally, a data strobe signal used in a DRAM device has the same drivability and timing as output data at a read operation and is also used as a signal indicating that the data are output into a CPU and a controller outside the memory chip. When a write operation is carried out, the data strobe signal is input into the DRAM device with the same timing as input data so that the data strobe signal indicates that input data is to be written in a cell.

Figure 1:
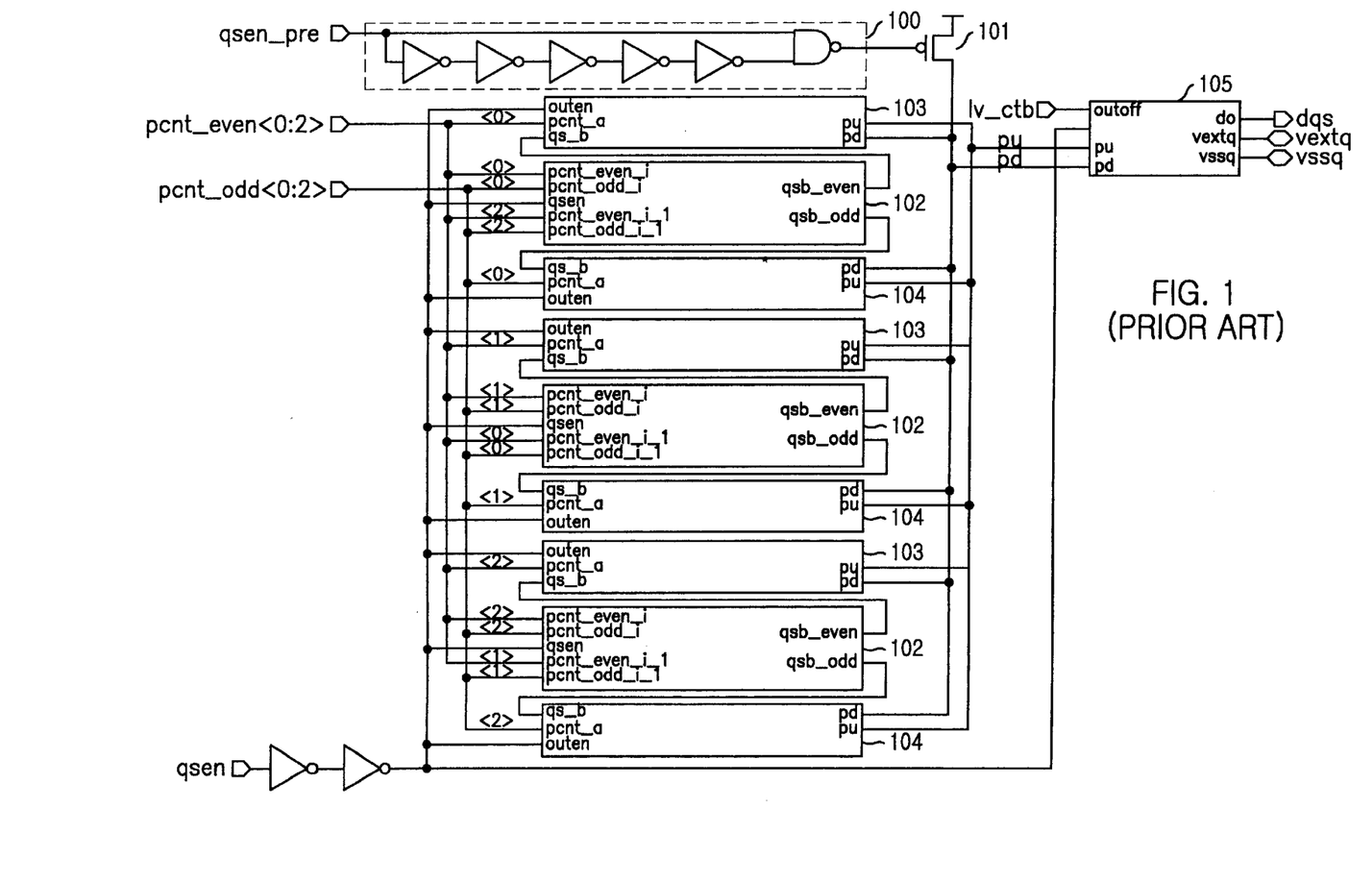
FIG. 1 is a block diagram illustrating a conventional data strobe signal generator.

FIG. 1 is a block diagram illustrating a conventional data strobe signal generator. As shown in FIG. 1, the conventional data strobe signal generator includes a pulse generator 100, a PMOS transistor 101, a current output state signal generator 102, first and second pull-up/pull-down signal generators 103 and 104 and a data strobe signal driver 105. The pulse generator 100 receives a data strobe preamble signal qsen_pre and produces a pulse. The PMOS transistor 101 controls a preamble state of the data strobe signal driver 105 in response to an output from the pulse generator 100. The current output state signal generator 102 receives first and second pipe counter signals pcnt_even <0:2> and pcnt_odd <0:2> and a data strobe enable signal qsen and produces first and second state signals qsb_even and qsb_odd for outputting a data strobe signal in advance. The first pull-up/pull-down signal generator 103 receiving the first pipe counter signal pcnt_even <0:2>, the data strobe enable signal qsen and the first state signal qsb_even from the current output state signal generator 102 produces pull-up and pull-down signals pu and pd and the second pull-up/pull-down signal generator 104 receiving the second pipe counter signal pcnt_odd <0:2>, the data strobe enable signal qsen and the second state signal qsb odd from the current output state signal generator 102 produces pull-up and pull-down signals pu and pd. The data strobe signal driver 105 outputs a data strobe signal dqs in response to the pull-up and pull-down signals pu and pd.

Figure 2:
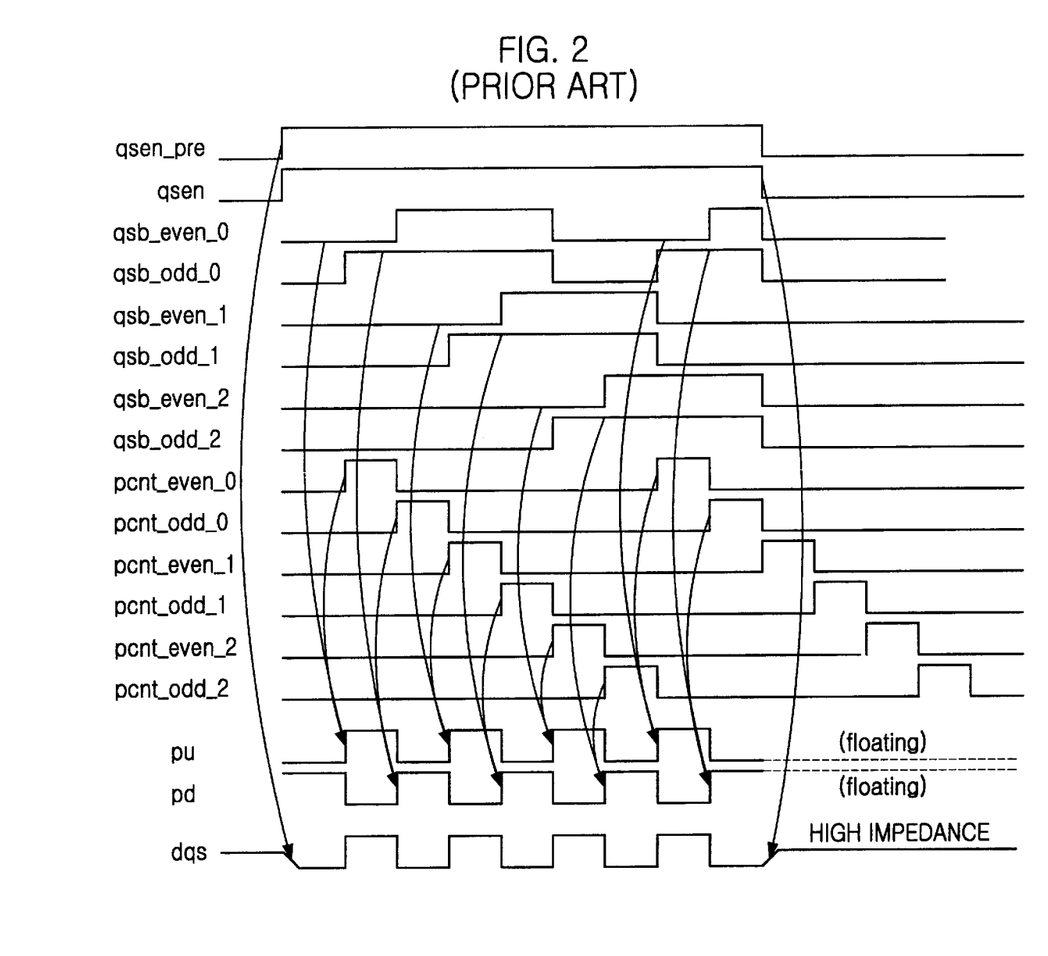
FIG. 2 is a timing chart of the conventional data strobe signal generator in FIG. 1.

Referring to FIG. 2, a preamble state of the data strobe signal dqs starts when the data strobe preamble signal qsen_pre goes from a logic low state to a logic high state and such a preamble state is over when the data strobe enable signal qsen goes from a logic high state to a logic low state. The pull-up signal pu is activated by the first state signal qsb_even and the first pipe counter signal pcnt_even <0:2> and the pull-down signal pd is activated by the second state signal qsb_odd and the second pipe counter signal pcnt_odd <0:2>.

Figure 3:
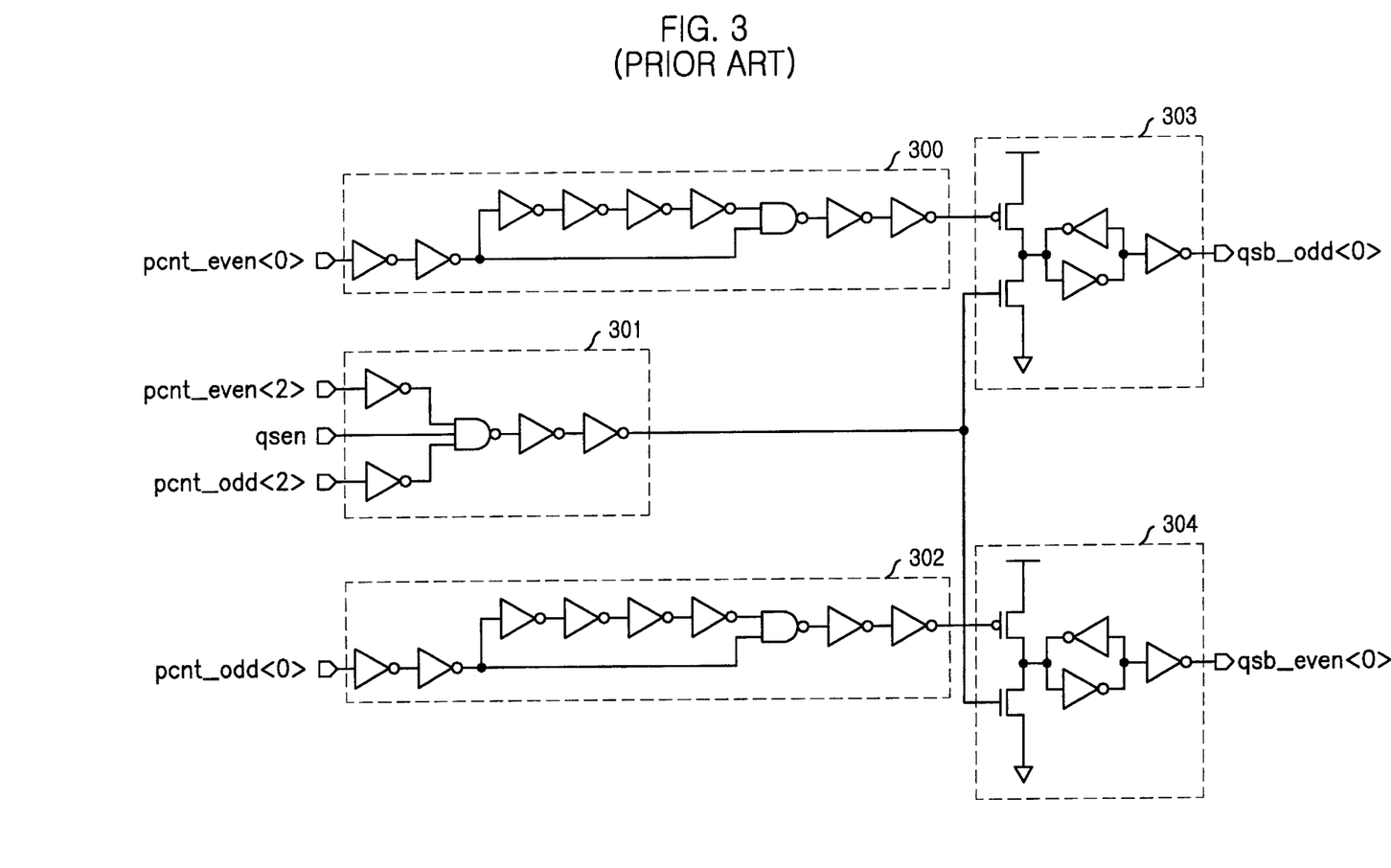
FIG. 3 is a circuit diagram illustrating a current output state signal generator in FIG. 1.

Referring to FIG. 3, the current output state signal generator 102 includes a first pulse generator 300 receiving first pipe counter signal pcnt_even <0> to produce a pulse, an input unit 301 ANDing the first pipe counter signal pcnt_even <2>, the data strobe enable signal qsen and the second pipe counter signal pcnt_odd <2>, and a second pulse generator 302 receiving the second pipe counter signal pcnt_odd <0> to produce a pulse. Also, the current output state signal generator 102 includes a first output unit 303 receiving outputs from the first pulse generator 300 and the input unit 301 to produce the second state signal qsb_odd <0> and a second output unit 304 receiving outputs from the second pulse generator 302 and the input unit 301 to produce the first state signal qsb_even <0>.

Figure 4:
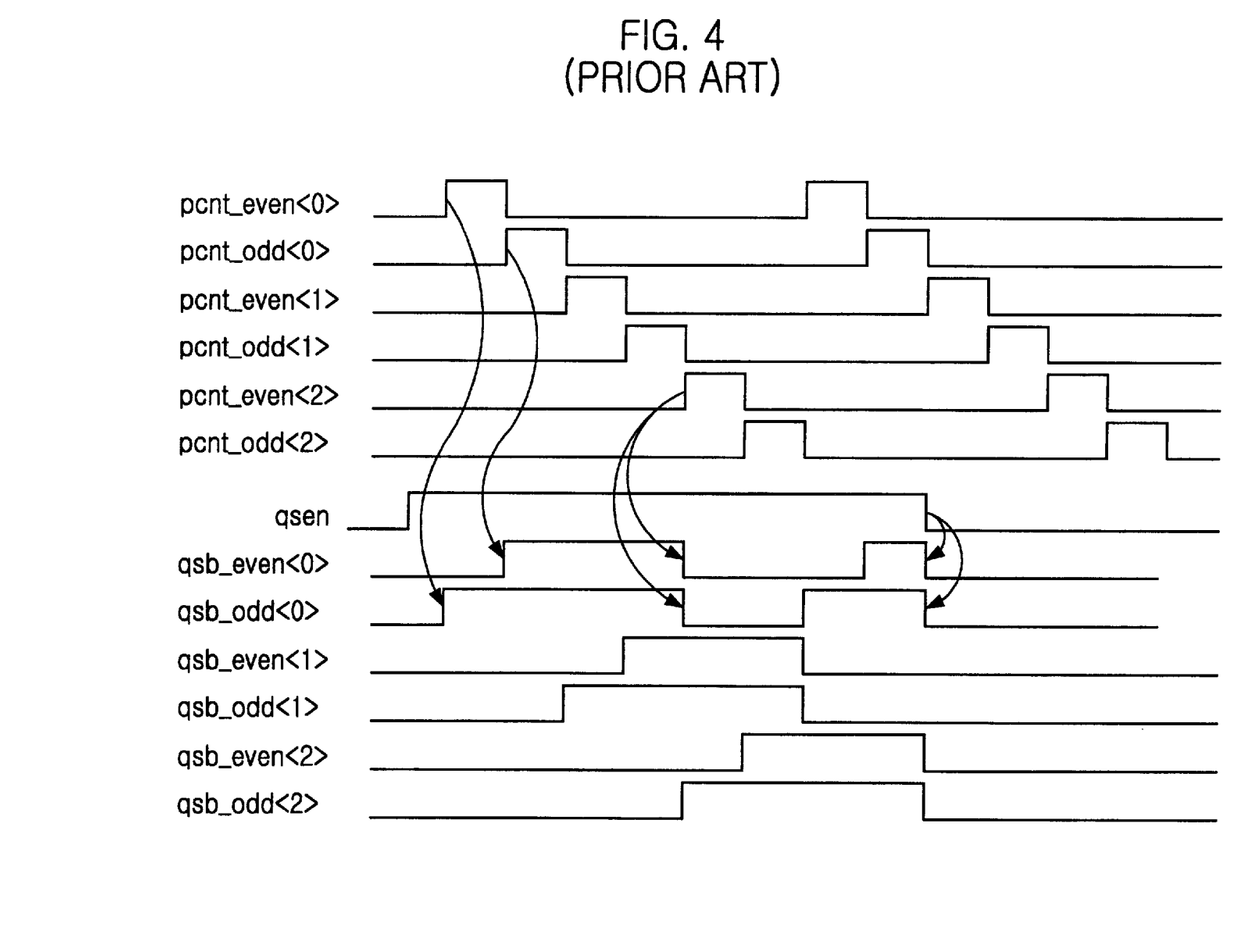
FIG. 4 is a timing chart of the current output state signal generator in FIG. 3.

Referring to FIG. 4 showing a timing chart of each signal in the current output state signal generator 102, the second state signal qsb_odd <0> is activated by the first pipe counter signal pcnt_even <0> and the first state signal qsb_even <0> is activated by the second pipe counter signal pcnt_odd <0>. Also, the activation of the first and second state signals qsb_even <0> and qsb_odd <0> is terminated at a rising edge of the first pipe counter signal pcnt_even <2>.

Figure 5:
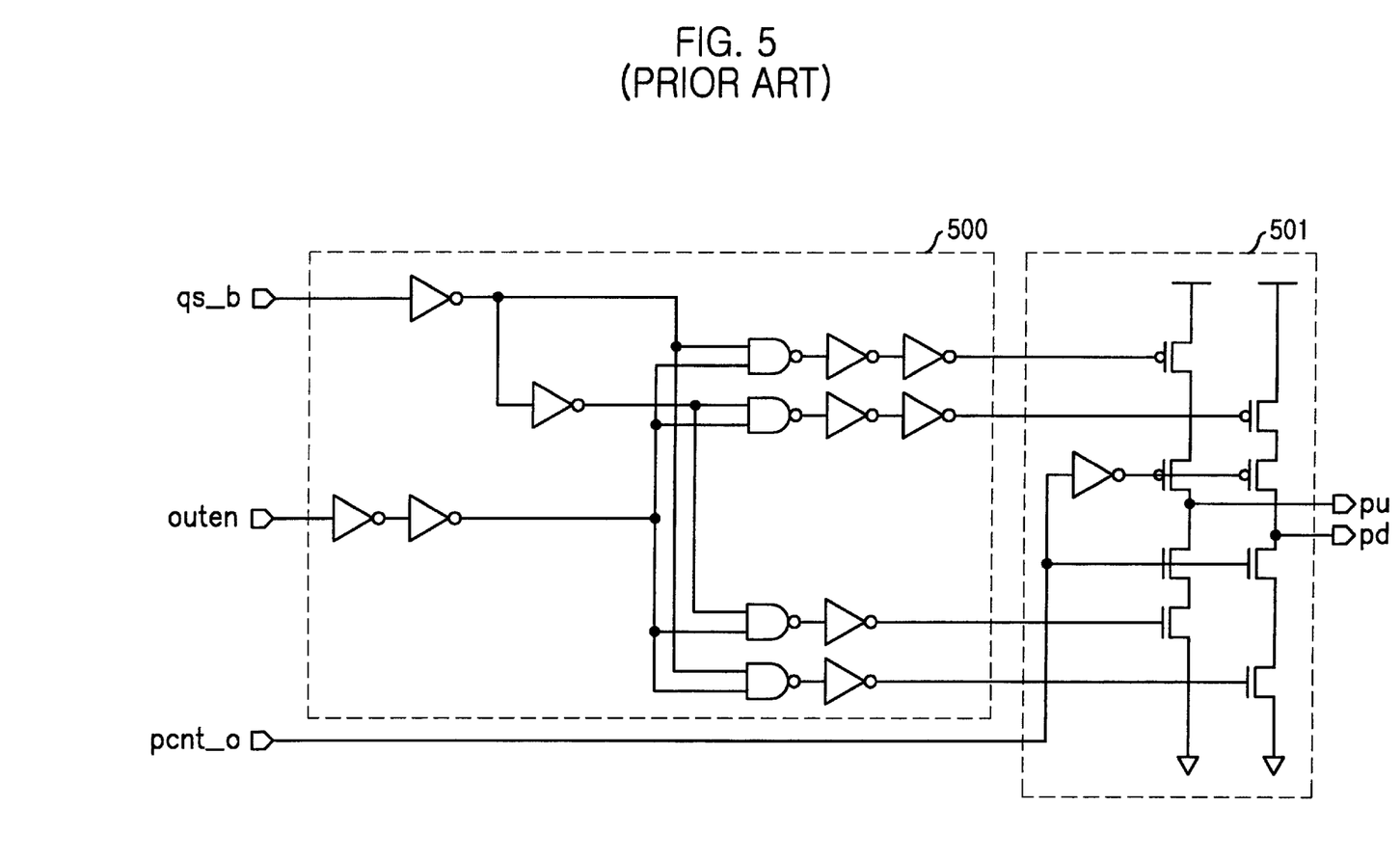
FIG. 5 is a circuit diagram illustrating a pull-up/pull-down signal generator in FIG. 1.

Referring to FIG. 5, each of the first and second pull-up/pull-down signal generators 103 and 104 includes an input unit 500 and a pull-up and pull-down signal driver 501. The input unit 500 receives one of the first and second state signals qsb_even <0> and qsb_odd <0>, a signal qs_b, and an output enable signal outen, which is produced by delaying the data strobe enable signal qsen, for NANDing the received signals. The pull-up and pull-down signal driver 501 receives an output from the input unit 500 and one of the first and second pipe counter signals pcnt_even <0:2> and pcnt_odd<0:2>, a signal pcnt_o, and drives the pull-up and pull-down signals pu and pd.

Figure 6:
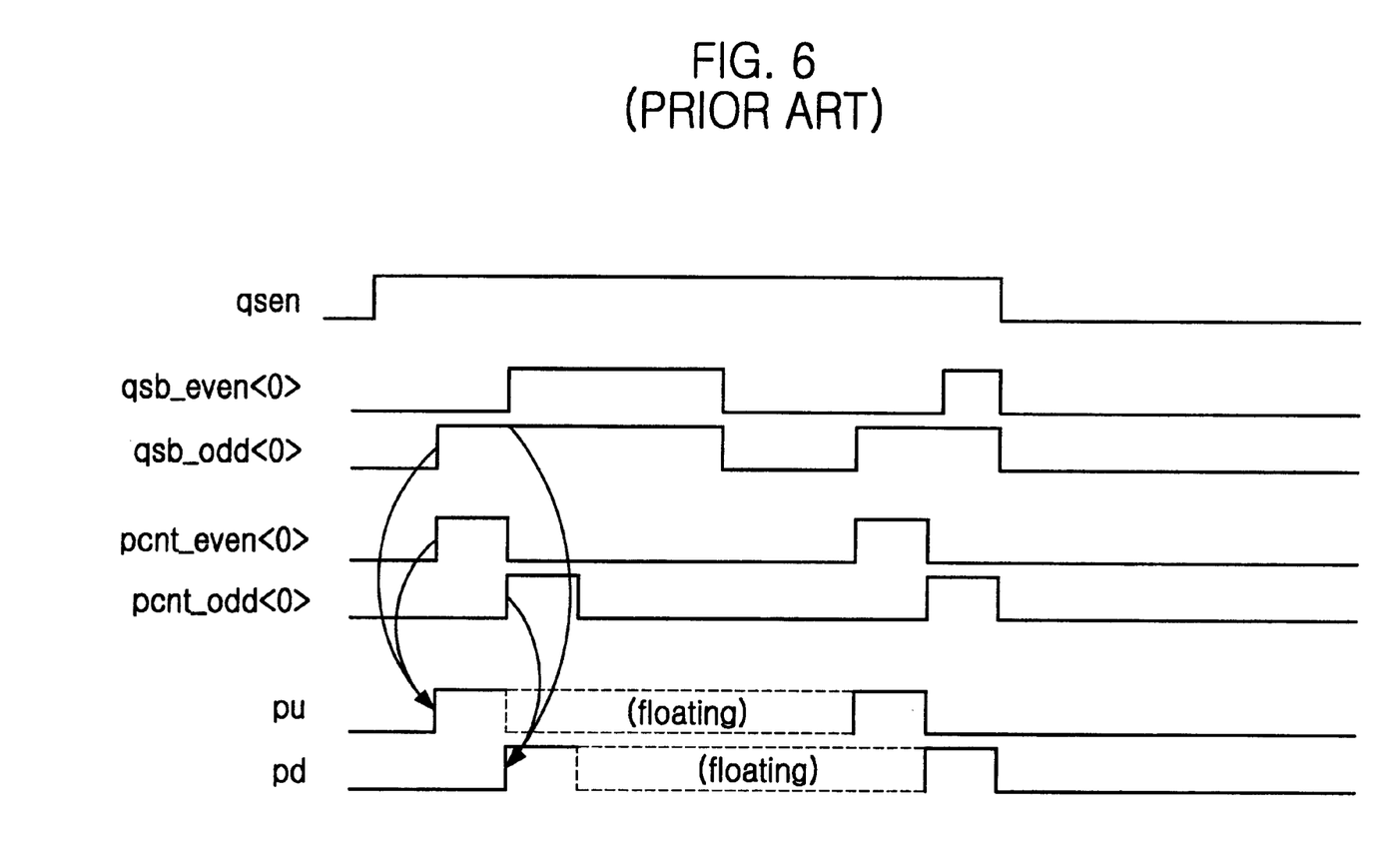
FIG. 6 is a timing chart of the pull-up/pull-down signal generators in FIG. 5.

Referring to FIG. 6, the data strobe enable signal qsen is activated in a logic high state and the first state signal qsb_even <0> and the first pipe counter signal pcnt_even <0> activate the pull-up signal pu. Also, the second state signal qsb_odd <0> and the second pipe counter signal pcnt_odd <0> enable another pull-up/pull-down signal generator 104, then produce the pull-down signal pu.

Figure 7:
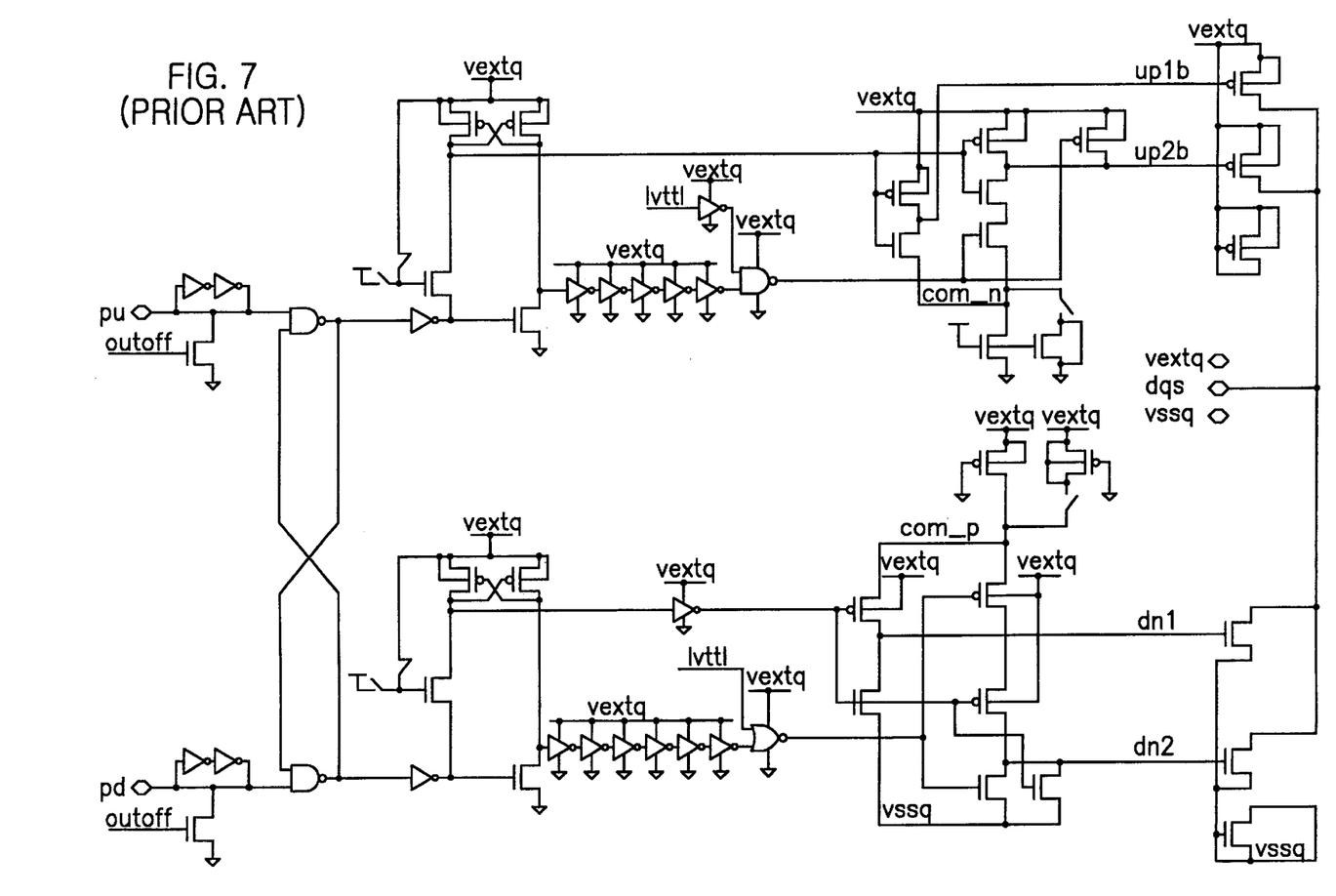
FIG. 7 is a circuit diagram illustrating a conventional data strobe signal driver.

The data strobe signal driver 105 in FIG. 7 is implemented by a common output buffer employed in a typical data output stage of a semiconductor device so that detail description will be omitted. However, the data strobe signal driver 105 in FIG. 7 has a latch circuit in its input stage and the latch circuit may be rest by a reset signal outoff. When the pull-up and pull-down signals pu and pd are in a logic low state, the data strobe signal dqs is in a high impedance state, and when one of the pull-up and pull-down signals pu and pd is in a logic high state, the data strobe signal dqs may be outputted. If the pull-up signal pu is activated in a logic high signal, the data strobe signal dqs is output as a high signal and if the pull-down signal pd is activated in a logic low signal, the data strobe signal dqs is output as a low signal.

However, the conventional data strobe signal generator uses the output of the pipe counter, which has been used in a previous operation, in order to produce the data strobe signal to be required in a current data output. Accordingly, in order to use the previously used pipe counter signal, the conventional data strobe signal generator is in need of the current output state signal generator so that a complicated layout and a large area are required.

SUMMARY OF THE INVENTION

It is, therefore, an object of the present invention to provide a semiconductor memory device occupying a small area of a chip.

It is another object of the present invention to provide a semiconductor memory device with a low-power consumption and a simple layout, by improving a data strobe signal generator.

In accordance with an aspect of the present invention, there is provided a data strobe signal generator in a SDRAM memory device, comprising: a preamble controller for controlling a preamble state of a data strobe signal in response to a control signal; a plurality of pull-up/pull-down signal drivers for producing pull-up and pull-down signals through a toggling operation in response to previous pull-down and pull-up signals; and a data strobe signal driver for outputting the data strobe signal in response to the pull-up and pull-down signals.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, the present invention will be described in detail referring the accompanying drawings.

Figure 8:
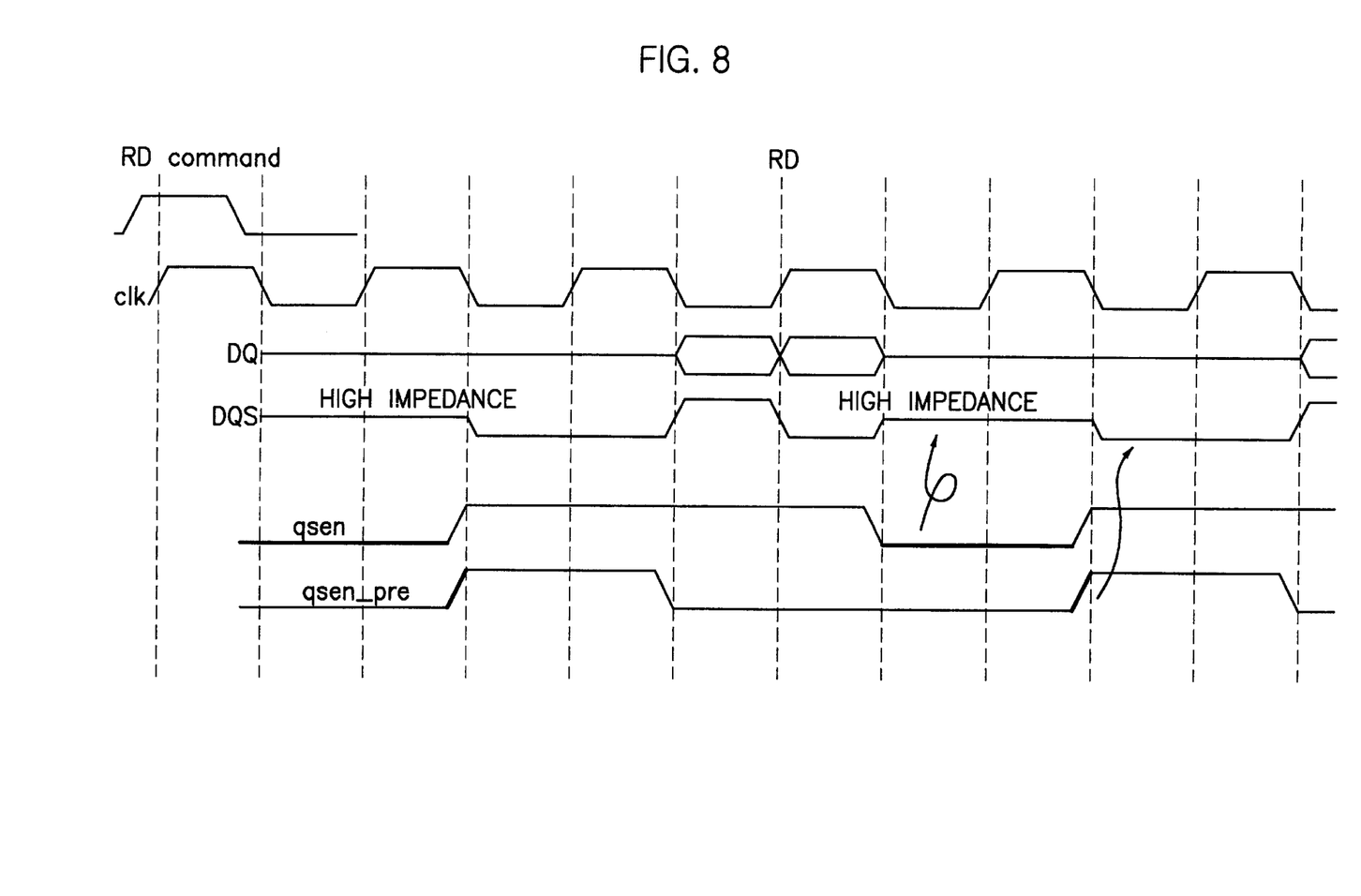
FIG. 8 is a timing chart of signals applied to a DDR SDRAM device.

For convenience' sake, first, FIG. 8 showing a timing chart of data strobe signal generator in FIG. 9 will be described. A clock signal clk, a data strobe signal dqs, a data strobe enable signal qsen and a data strobe preamble signal qsen_pre are shown in FIG. 8 and these signals are taken when the burst length is of 2 and the CAS latency (CL) is of 2.5.

Two data dq are continuously output within one period of a clock signal clk, being synchronized with rising and falling edges of the clock signal clk. When a read command rd is input, the data strobe signal dqs maintains a high impedance state. Then, the data strobe signal dqs doesn't go from the high impedance state to a logic low state until one and half period of the clock signal elapses from the read command input. It is a "preamble" state that the data strobe signal dqs is in a logic low state before the data are output. If the data are output, the data strobe signal dqs is synchronized with the first output data so that the data strobe signal dqs goes from the preamble state to a logic high state. With the next data output, the data strobe signal dqs goes from the logic high state to a logic low state. If the data are continuously output (the burst length is of more than 2), the data strobe signal dqs is toggled with a transition from the logic low state to a logic high state or with a transition from the logic high state to a logic low state. When the data output has been completed, the data strobe signal dqs goes again to the high impedance state, notifying an external circuit that there is not any output of data.

On the other hand, the data strobe enable signal qsen is in a standby state at the beginning and is not activated in a logic high state until one and half period of the clock signal elapses from the read command rd. That is, while the data strobe enable signal qsen is in a logic low state, the data strobe signal dqs should be in the high impedance state so that it from an external circuit may be received. While the data strobe enable signal qsen is in a logic high state, the data strobe signal dqs should be driven within the memory device. Also, as described below, the data strobe preamble signal qsen_pre controls the preamble state of the data strobe signal dqs.

The apparatus generating the data strobe enable signal qsen and the data strobe preamble signal qsen_pre is well-known to those skilled in the art to which the subject matter pertains, so the detailed description of it will be omitted if such an omission doesn't have influence on the scope of appended claims and their equivalents.

Figure 9:
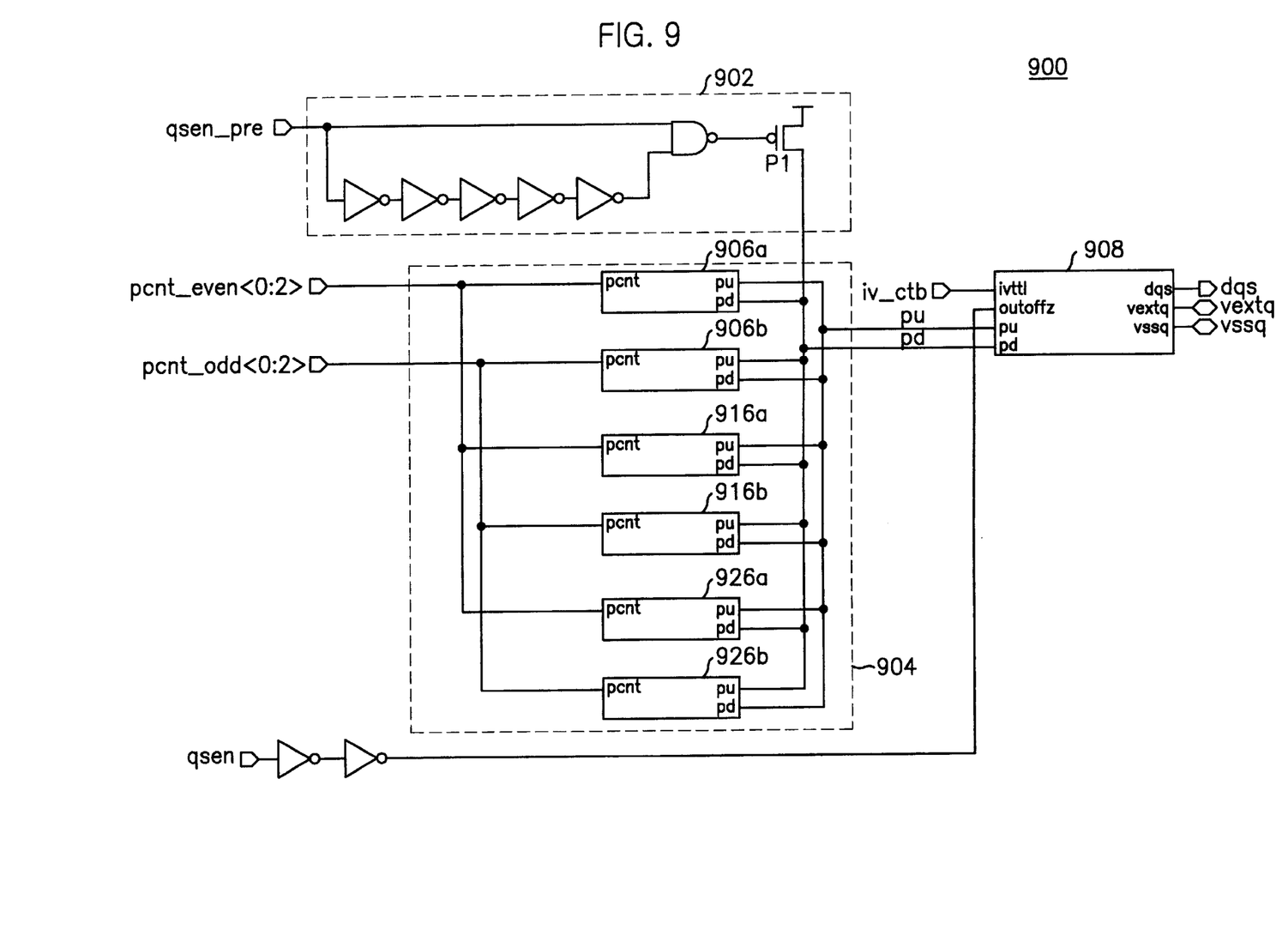
FIG. 9 is a circuit diagram of a data strobe signal generator according to an embodiment of the present invention.

Referring to FIG. 9, a data strobe signal generator 900 generating the data strobe signal dqs includes a preamble controller 902 for controlling the preamble state of the data strobe signal dqs, a pull-up/pull-down signal generator 904 for receiving pipe counter signals pcnt_even and pcnt_odd as first and second control signals and for generating pull-up and pull-down signals, and a data strobe signal driver 908 for outputting the data strobe signal dqs in response to the pull-up and pull-down signals.

The preamble controller 902 senses a rising edge of the data strobe preamble signal qsen_pre and generates a preamble control pulse having a predetermined pulse width. The preamble control pulse is a low enable signal which is activated when a high-to-low logic transition is achieved. The preamble control pulse applied to a gate electrode of a PMOS transistor P1 causes the pull-down signal pd to be in a logic high state.

First, the data strobe signal driver 908 receiving the pull-up and pull-down signals pu and pd will be described.

Figure 10:
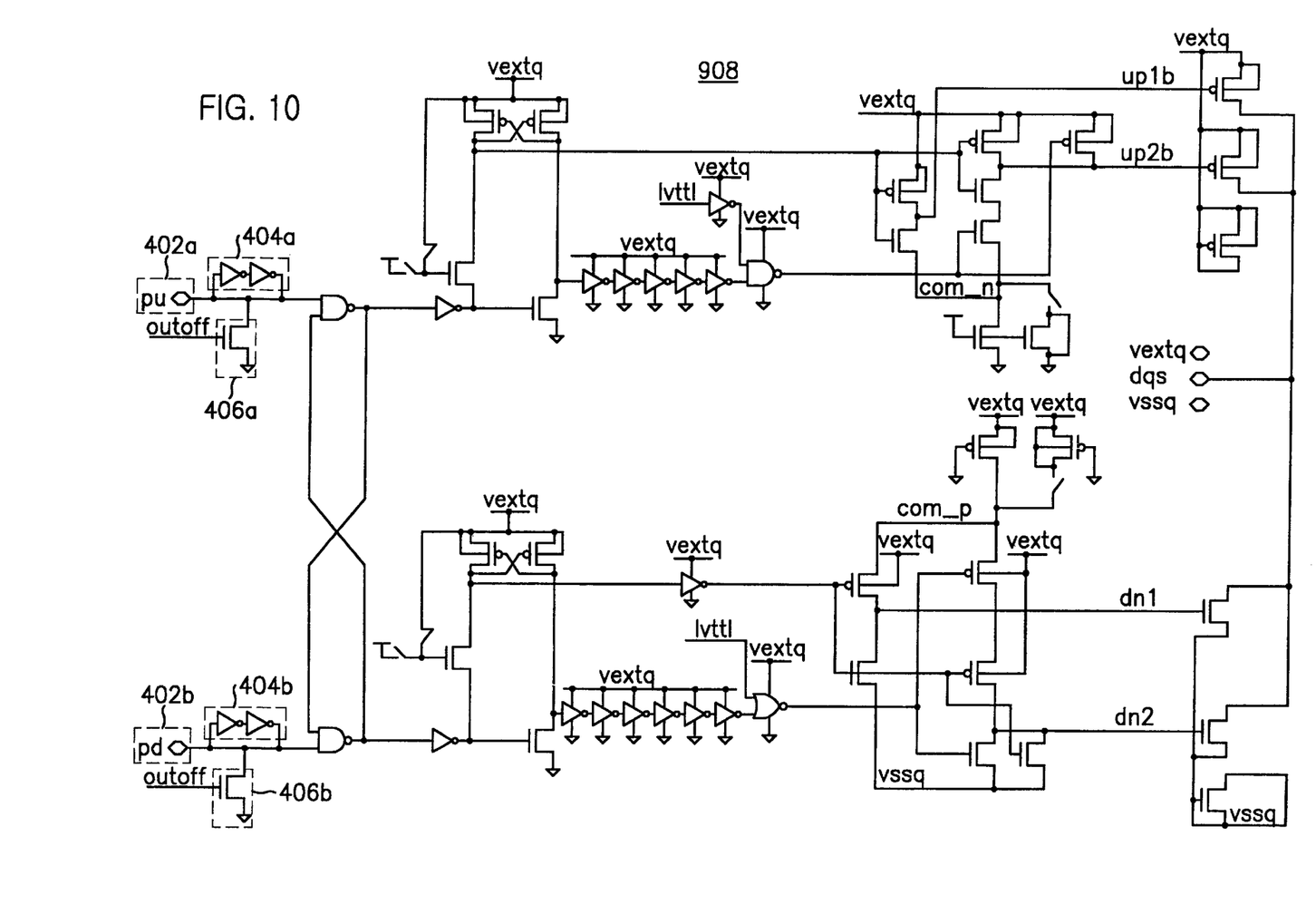
FIG. 10 is a circuit diagram illustrating a data strobe signal driver in FIG. 9.

Referring to FIG. 10, the drivability of the data strobe signal driver 908 is similar to that of a data output driver used in typical data pins of semiconductor devices. That is, latch circuits 404a and 404b are formed in input terminals 402a and 402b receiving the pull-up and pull-down signals pu and pd, respectively, so that each of the pull-up and pull-down signals pu and pd is respectively stored in the latch circuits 404a and 404b. The input terminals 402a and 402b are respectively coupled to reset units 406a and 406b, which receive an output cutoff signal outoff to delay the data strobe enable signal qsen and to invert the delayed data strobe enable signal qsen. The input terminals 402a and 402b are initialized in a logic low state by the reset units 406a and 406b, respectively, and the data strobe signal dqs may be in the high impedance state.

When the output cutoff signal outoff goes from a logic high state to a logic low state, the input terminals 402a and 402b may receive the pull-up and pull-down signals pu and pd, respectively. If one of the pull-up and pull-down signals pu and pd is in a logic high state, the data strobe signal dqs is output in response to such a logic state. That is, if the pull-up signal pu is in a logic high state, the data strobe signal dqs is output in a logic high state and, if the pull-down signal pd is in a logic high state, the data strobe signal dqs is output in a logic low state. Accordingly, if the pull-down signal pd is in a logic low state under the control of the preamble control pulse from the preamble controller 902, the data strobe signal dqs of a logic low state is output at an output terminal of the data strobe signal driver 908. Other parts of the data strobe signal driver 908 have the same configurations as typical data output drivers, so detailed description will be omitted.

Referring again to FIG. 9, the pull-up/pull-down signal generator 904 includes three pairs of pull-up/pull-down signal drivers 906a and 906b, 916a and 916b and 926a and 926b. This data output path is based on DDR SDRAMs having three pipeline structures. The pipeline structures have been used when a data access of the memory device is lower than an external clock frequency or when the data output faster than an internal data access is required. In these pipeline structures, a plurality of accessed internal data are stored in latch circuits and then continuously output. Accordingly, the number of pipelines is alternatively selected by a designer and then the present invention covers the modification and variation of the pipelines. Also, the pipe counter signals pcnt_even and pcnt odd are well-known to those skilled in the art to which the subject matter pertains, so the detailed description of it will be omitted.

Referring again to FIG. 9, each of the pull-up/pull-down signal drivers 906a and 906b, 916a and 916b and 926a and 926b receives the first and second pipe counter signals pcnt_even<0:2> and pcnt_odd<0:2>. Further, the pull-up and pull-down signal output nodes are cross-coupled to each other. That is, the pull-up signal output nodes of the pull-up/pull-down signal drivers 906a, 916a and 926a are coupled to the pull-down signal output nodes of the pull-up/pull-down signal drivers 906b, 916b and 926b and the pull-down signal output nodes of the pull-up/pull-down signal drivers 906a, 916a and 926a are coupled to the pull-up signal output nodes of the pull-up/pull-down signal drivers 906b, 916b and 926b. Therefore, the pull-up signal output nodes of the pull-up/pull-down signal drivers 906a, 916a and 926a and the pull-down signal output nodes of the pull-up/pull-down signal drivers 906b, 916b and 926b are coupled to the input terminal 402a for the data strobe signal driver 908 and also the pull-down signal output nodes of the pull-up/pull-down signal drivers 906a, 916a and 926a and the pull-up signal output nodes of the pull-up/pull-down signal drivers 906b, 916b and 926b are coupled to the input terminal 402b for the data strobe signal driver 908.

Figure 11:
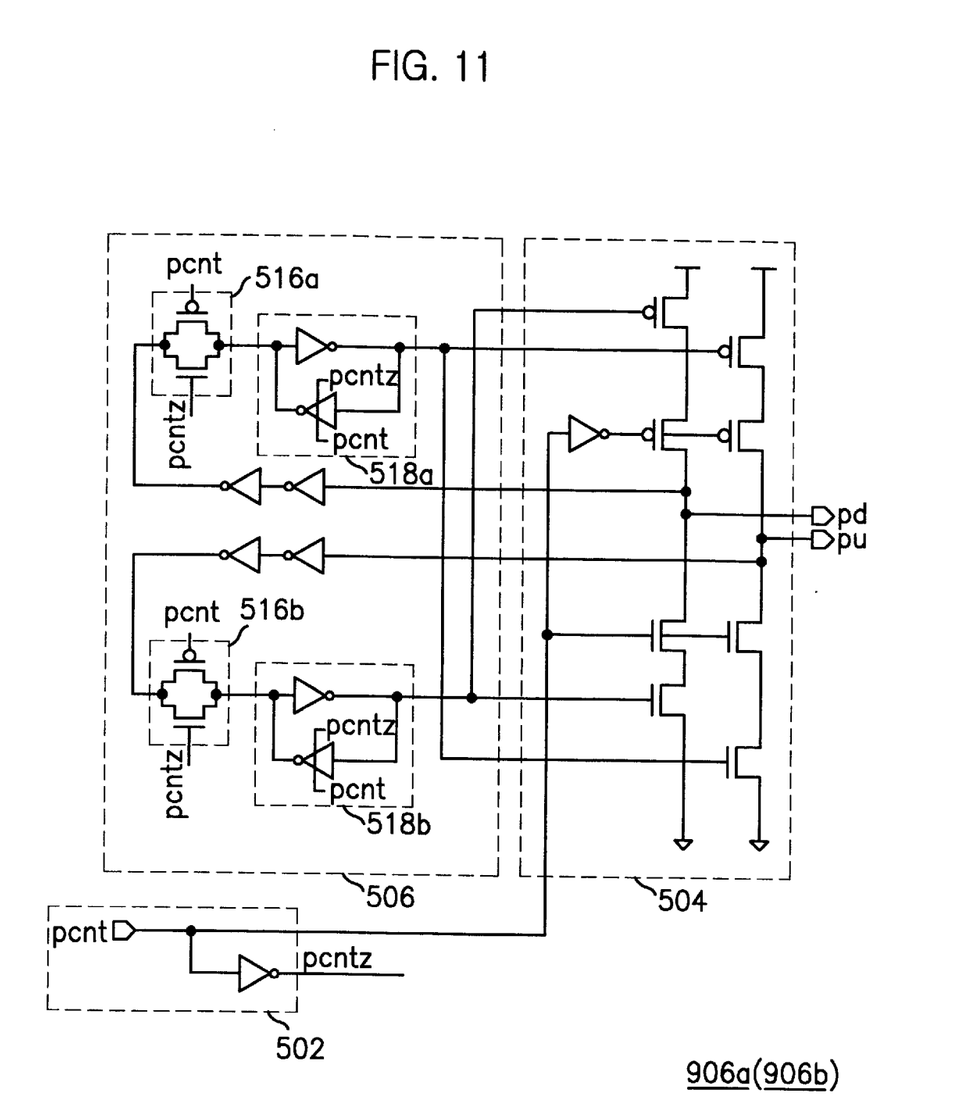
FIG. 11 is a circuit diagram illustrating a pull-up/pull-down signal driver in FIG. 9.

Referring to FIG. 11, the pull-up/pull-down signal drivers 906a and 906b, 916a and 916b and 926a and 926b are all the same, except for the connection of their output terminals to the input terminals of the data strobe signal driver 908. For example, the pull-up/pull-down signal driver 906a includes an input terminal 502 for receiving the pipe counter signal pcnt and producing the inverted pipe counter signal pcntz by an inverter, a controller 506 for receiving the pull-up and pull-down signals pu and pd in response to the pipe counter signal pcnt and the inverted pipe counter signal pcntz and producing control signals controlling the pull-up and pull-down signals pu and pd, and an output terminal 504 which is controlled by the input terminal 502 and the controller 506.

Figure 12:
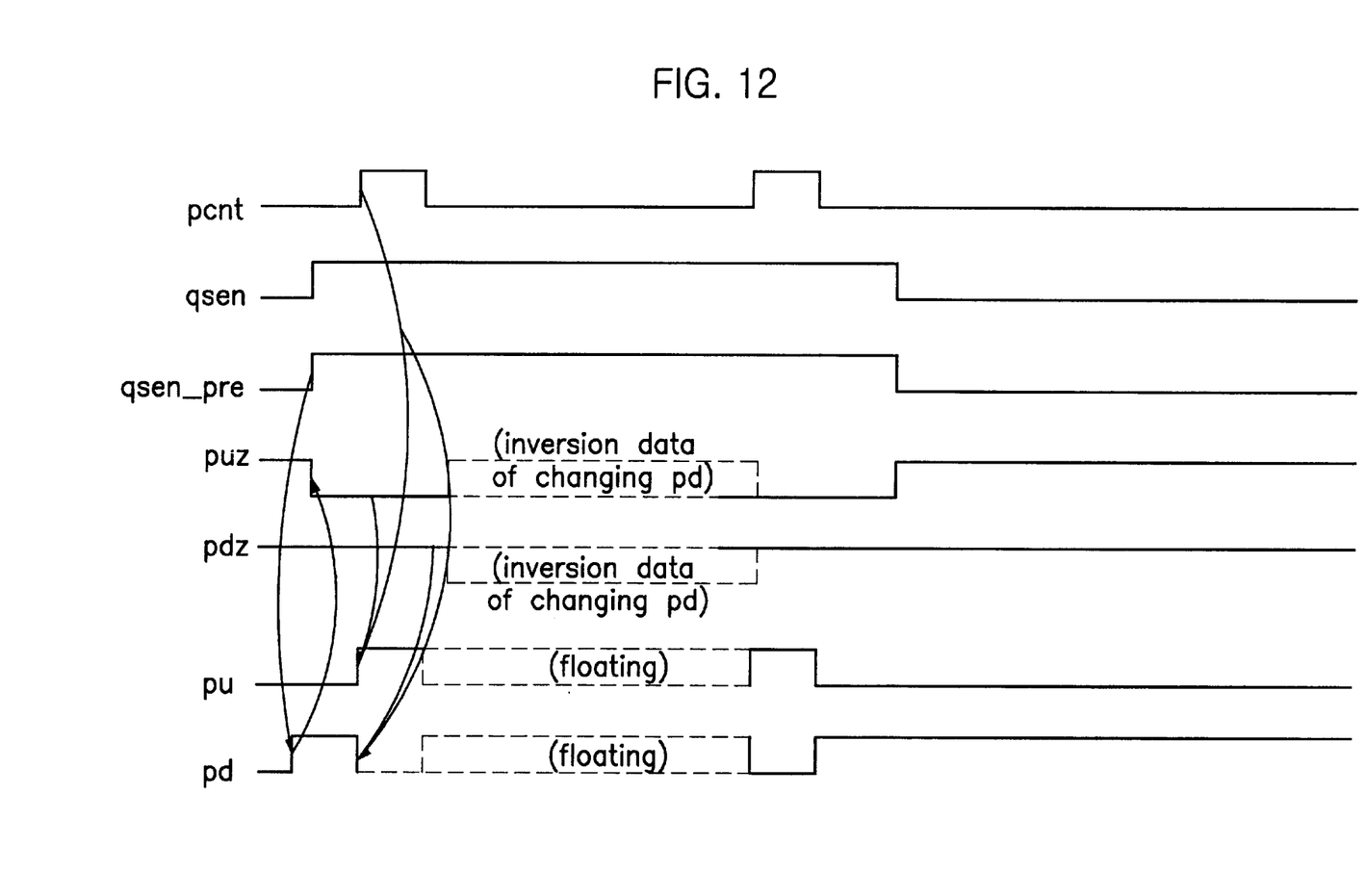
FIG. 12 is a timing chart of the pull-up/pull-down signal driver in FIG. 9.

Referring to FIGS. 11 and 12, while the pipe counter signal pcnt is in a logic low state, transmission gates 516a and 516b in the controller 506 are turned on and the pull-up and pull-down signals pu and pd are inverted by inverting latches 518a and 518b, respectively. The inverted pull-up and pull-down signals puz and pdz control the output terminal 504. Here, referring again to FIG. 10, since the input terminals 402a of the data strobe signal driver 908 is initialized in a logic low state, the output terminal 504 of the pull-up/pull-down signal driver 906a is also initialized in a logic low state. At this time, when the data strobe preamble signal qsen pre is activated, since a PMOS transistor P1 of the preamble controller 902 is coupled to the pull-down signal output nodes of the pull-up/pull-down signal drivers 906a, 916a and 926a, their pull-down signal output nodes may be in a logic high state. On the other hand, since a PMOS transistor P1 of the preamble controller 902 is coupled to the pull-up signal output nodes of the pull-up/pull-down signal drivers 906b, 916b and 926b, their pull-up signal output nodes may be in a logic high state.

Next, when the pipe counter signal pcnt is activated, the transmission gates 516a and 516b of the controller 506 are turned off and the inverting latches 518a and 518b are enabled, thereby storing the inverted pull-up and pull-down signals puz and pdz. Only one of the pull-up/pull-down signal drivers 906a, 916a, 926a, 906b, 916b and 926b is enabled by the pipe counter signal pcnt (see timing chart in FIG. 13). Therefore, the pull-up or pull-down signal pu or pd, which is output by the next pipe counter signal pcnt, and the previous signal are out of phase.

Figure 13:
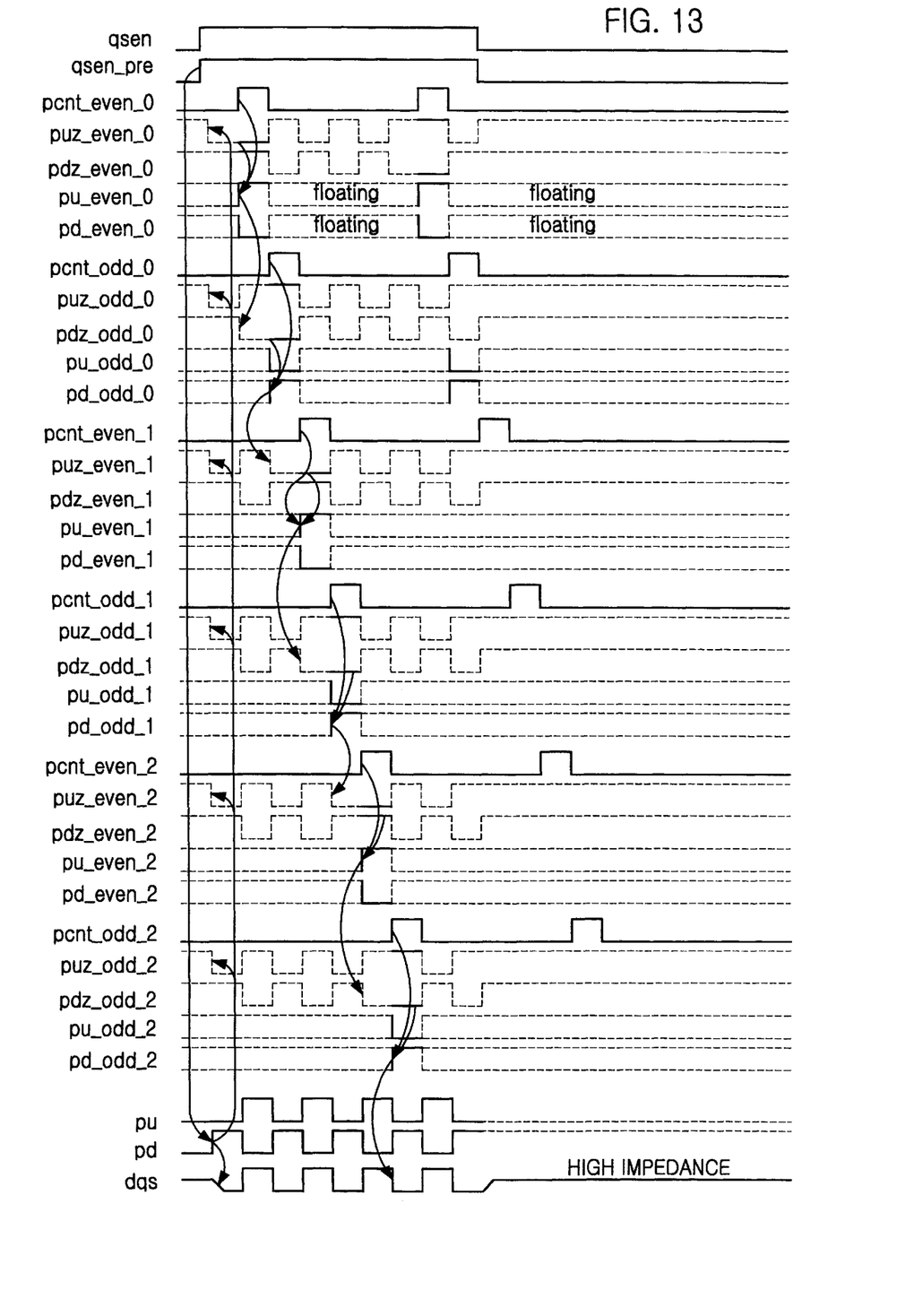
FIG. 13 is a timing chart of the data strobe signal generator in FIG. 9.

Referring to FIG. 13, while the data strobe enable signal qsen is not activated in a logic low state, the pull-up and pull-down signals pu and pd are initialized in a logic low state so that the data strobe signal qds is maintained in a high impedance state. Next, when the data strobe enable signal qsen is activated in a logic high state, the input terminals 402a and 402b of the data strobe signal driver 908 may receive the pull-up and pull-down signals pu and pd, respectively. Accordingly, with the activation of the data strobe preamble signal qsen_pre, the pull-down signal pd is activated in a logic high state and the data strobe signal dqs is in a preamble state (logic low). At this time, since the pipe counter signal is in a logic low state, the transmission gates 516a and 516b transfer the outputs of the pull-up/pull-down signal driver 906a to the output terminal 504 thereof, thereby toggling the pull-up and pull-down signals.

Subsequently, when the pipe counter signal pcnt (in FIG. 13, pcnt_even_0) is input in a logic high state, the corresponding pull-up/pull-down signal driver 906a outputs the pull-up and pull-down signals with phase shift so that the current pull-up and pull-down signals and the previous pull-up and pull-down signals are out of phase. The outputs from the pull-up/pull-down signal driver 906a are input into other pull-up/pull-down signal drivers, which are not enabled, and the pull-up/pull-down signal driver 906b is enabled by the next pipe counter signal (in FIG. 13, pcnt_odd_0) and shifts the phase thereof. As a result, as the pull-up and pull-down signals are toggled by the pipe counter signal pcnt, the data strobe signal dqs are also toggled.

Figure 14:
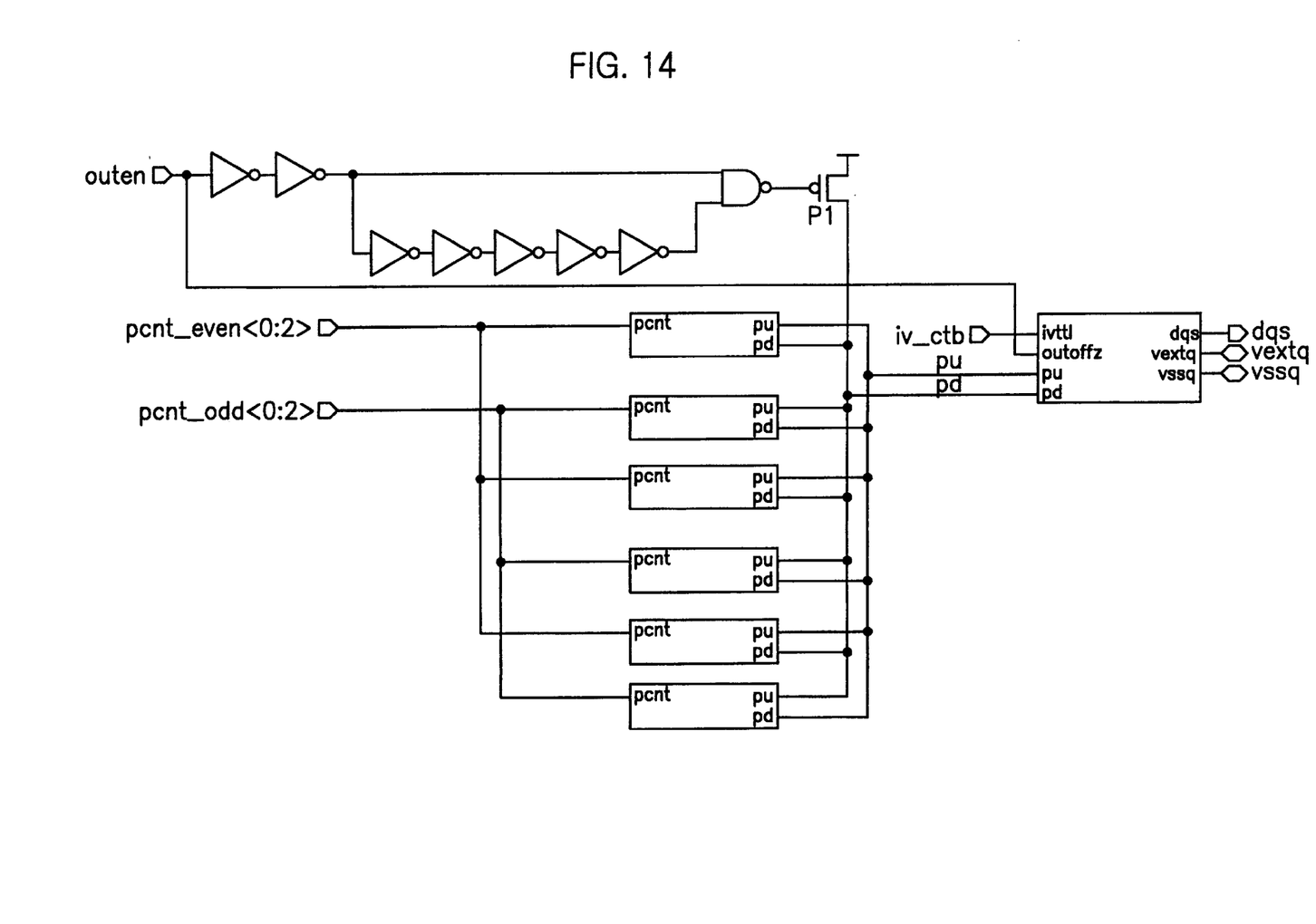
FIG. 14 is a circuit diagram of a data strobe signal generator according to another embodiment of the present invention.

FIG. 14 is a data strobe signal generator according to another embodiment of the present invention. As shown in FIG. 14, the data strobe signal generator in FIG. 14 produces the same data strobe signal dqs as that in FIG. 9, by using only the output enable signal, instead of using the data strobe enable signal qsen or the data strobe preamble signal qsen_pre.

As apparent from the above, the data strobe signal generator according to the present invention does not have to use a current output state signal generator, by using a pipe counter signal which has been issued at the previous read operation, thereby providing various advantages, such as simple circuit design and small chip size.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. A data strobe signal generator in a SDRAM memory device, comprising:

a preamble controller for controlling a preamble state of a data strobe signal in response to a control signal;

a plurality of pull-up/pull-down signal drivers for producing pull-up and pull-down signals through a toggling operation in response to previous pull-down and pull-up signals; and a data strobe signal driver for outputting the data strobe signal in response to the pull-up and pull-down signals.

2. The data strobe signal generator as recited in claim 1, wherein each of the pull-up/pull-down signal drivers comprises:

a first output driver including a first pull-up and pull-down means for driving the pull-up signals;

a second output driver including a second pull-up and pull-down means for driving the pull-down signals;

a first control means receiving the previous pull-up signal in response to a first or second pipe counter signal and controlling the second pull-up and pull-down means of the second output driver using the received previous pull-up signal; and a second control means receiving the previous pull-down signal in response to the first or second pipe counter signal and controlling the first pull-up and pull-down means of the first output driver using the received previous pull-down signal.

3. The data strobe signal generator as recited in claim 2, wherein the first output driver further includes a third pull-up and pull-down means for driving the pull-up signals and the second output driver further includes a fourth pull-up and pull-down means for driving the pull-down signals and wherein the third and fourth pull-up and pull-down means are controlled by the first or second pipe counter signal.

4. The data strobe signal generator as recited in claim 1, wherein each of the pull-up/pull-down signal drivers comprises:

a first output driver including a first pull-up and pull-down means for driving the pull-up signals;

a second output driver including a second pull-up and pull-down means for driving the pull-down signals; and a plurality of control means responsive to a first or second pipe counter signal for controlling the first output driver using the previous pull-up and pull-down signals.

5. The data strobe signal generator as recited in claim 4, wherein the first output driver further includes a third pull-up and pull-down means for driving the pull-up signals and the second output driver further includes a fourth pull-up and pull-down means for driving the pull-down signals and wherein the third and fourth pull-up and pull-down means are controlled by the first or second pipe counter signal.

6. The data strobe signal generator as recited in claim 1, wherein the control signal is a data strobe preamble signal.

7. The data strobe signal generator as recited in claim 1, wherein the control signal is a data output enable signal.

* * * * *